(12) United States Patent
Haeberlen et al.

(10) Patent No.: US 10,680,069 B2
(45) Date of Patent: Jun. 9, 2020

(54) SYSTEM AND METHOD FOR A GAN-BASED START-UP CIRCUIT

(71) Applicant: Infineon Technologies Austria AG, Villach (AT)

(72) Inventors: Oliver Haeberlen, St. Magdalen (AT); Gerald Deboy, Klagenfurt (AT)

(73) Assignee: INFINEON TECHNOLOGIES AUSTRIA AG, Villach (AT)

( * ) Notice: Subject to any disclaimer, the term of this patent is extended or adjusted under 35 U.S.C. 154(b) by 0 days.

(21) Appl. No.: 16/054,502

(22) Filed: Aug. 3, 2018

(65) Prior Publication Data

US 2020/0044032 A1    Feb. 6, 2020

(51) Int. Cl.

| H01L 23/00 | (2006.01) |
|---|---|
| H01L 29/20 | (2006.01) |
| H01L 29/778 | (2006.01) |
| H01L 29/417 | (2006.01) |
| H01L 29/66 | (2006.01) |
| H01L 29/06 | (2006.01) |

(52) U.S. Cl.
CPC ...... *H01L 29/2003* (2013.01); *H01L 29/0649* (2013.01); *H01L 29/41766* (2013.01); *H01L 29/66462* (2013.01); *H01L 29/7787* (2013.01)

(58) Field of Classification Search
CPC .................................................. H01L 29/2003
See application file for complete search history.

(56) References Cited

U.S. PATENT DOCUMENTS

| 6,940,126 B2* | 9/2005 | Deboy ................ H01L 29/0634 |
| | | 257/332 |
| 8,101,972 B2 | 1/2012 | Hikita et al. |
| 9,047,818 B1* | 6/2015 | Day ..................... G09G 3/3233 |
| 9,263,545 B2 | 2/2016 | Ostermaier et al. |
| 9,755,059 B2* | 9/2017 | Sriram .................. H01L 29/778 |
| 9,837,522 B2* | 12/2017 | Prechtl ................ H01L 29/1029 |
| 9,847,394 B2 | 12/2017 | Prechtl et al. |
| 2010/0302810 A1 | 12/2010 | Hsing et al. |
| 2013/0240901 A1 | 9/2013 | Kohda et al. |
| 2013/0294120 A1 | 11/2013 | Nomura et al. |
| 2014/0138704 A1 | 5/2014 | Tanaka et al. |
| 2015/0162303 A1* | 6/2015 | Cho .................... H01L 23/4334 |
| | | 257/76 |

(Continued)

FOREIGN PATENT DOCUMENTS

| JP | 2007081174 A | 3/2007 |
| JP | 2014011386 A | 1/2014 |
| WO | 2017071635 A1 | 5/2017 |

OTHER PUBLICATIONS

"1EDI20N12AF Single Channel MOSFET and GaN HEMT Gate Driver IC," 1EDI EiceDriver Compact, 1EDI20N12AF, Data Sheet, Rev. 2.0, Jun. 1, 2016, 22 pages.

(Continued)

*Primary Examiner* — Thao P Le
(74) *Attorney, Agent, or Firm* — Slater Matsil, LLP (57) ABSTRACT

In accordance with an embodiment, a circuit includes a first gallium nitride (GaN) transistor comprising a drain coupled to a drain node, a source coupled to a source node, and a gate coupled to a gate node; and a second GaN transistor comprising a drain coupled to the drain node, a source coupled to a first power source node configured to be coupled to a first capacitor.

20 Claims, 7 Drawing Sheets

(56) References Cited

U.S. PATENT DOCUMENTS

| | | | |
|---|---|---|---|
| 2017/0103978 A1* | 4/2017 | Prechtl | H01L 21/4825 |
| 2017/0104076 A1 | 4/2017 | Prechtl et al. | |
| 2017/0125572 A1 | 5/2017 | Curatola et al. | |
| 2017/0200817 A1* | 7/2017 | Curatola | H01L 22/26 |
| 2017/0222644 A1* | 8/2017 | Kinzer | H03K 17/6871 |
| 2017/0301613 A1* | 10/2017 | Lin | H01L 29/7787 |
| 2017/0365520 A1 | 12/2017 | Prechtl et al. | |
| 2018/0047719 A1 | 2/2018 | Vielemeyer et al. | |
| 2019/0123546 A1* | 4/2019 | Wang | H02H 7/1213 |

OTHER PUBLICATIONS

Deboy, Gerald et al., "Advanced Silicon Devices—Applications and Technology Trends," APEC, Mar. 2015, Infineon Technologies AG, 28 pages.

Jones, Edwards A., et al., "Application-Based Review of GaN HFETs," IEEE Workshop on Wide Bandgap Power Devices and Applications, Oct. 2014, pp. 24-29.

Mirsky, Gregory et al., "Depletion-mode MOSFET kick-starts power supply," EDN Network, Jan. 10, 2008, 2 pages.

Persson, Eric, "How 600 V GaN Transistors Improve Power Supply Efficiency and Density," Power Electronics Europe, Issue 2, wwwp.power-mag.com, Mar. 2015, 4 pages.

Persson, Eric, "Practical Application of 600 V GaN HEMTs in Power Electronics," Professional Education Seminar, S17, Mar. 16, 2015, 77 pages.

"Power MOSFET Electrical Characteristics," Toshiba Leading Innovation, Nov. 10, 2016, 11 pages.

\* cited by examiner

SYSTEM AND METHOD FOR A GAN-BASED START-UP CIRCUIT

TECHNICAL FIELD

The present invention relates generally to a system and method of a GaN-based startup circuit.

BACKGROUND

Switched-mode power supply (SMPS) converters are widely used in various electronic applications ranging from telecommunication equipment to automobiles. The SMPS system offers advantageous power conversion efficiency and increased design flexibility over linear regulators.

One challenge of SMPS design is managing power loss due to switching losses. One way to reduce such switching losses is to use gallium nitride GaN power devices instead of silicon-based transistors to implement switching transistors. The low parasitic capacitance and lower on-resistance of GaN power devices reduce switching losses compared to traditional silicon-based transistors. As such GaN power devices are increasingly being used to implement compact power chargers for portable electronic devices.

Another challenge of SMPS design, especially with respect with power circuits used in low-power, portable devices, is managing the start-up behavior of the SMPS. Since chargers for low-power portable devices typically do not include an auxiliary power supply, power produced by the SMPS itself is often used to supply power to the circuit that controls the various active switching components of the SMPS. One way to deal with this issue is to use power from AC line input to power the control circuitry during start-up of the SMPS. In some systems a high-ohmic resistor coupled to the AC line input is used to charge an input capacitor coupled to the control circuit. Such circuits, however, may continue to draw power from the AC line input when the SMPS is not operating and/or is in a standby mode, which may conflict with the extremely low standby power requirements of some portable device charging systems.

SUMMARY

In accordance with an embodiment, a method of starting a circuit includes receiving a first voltage at a drain node of a start-up circuit comprising a first gallium nitride (GaN) transistor having a drain coupled to the drain node, a second GaN transistor having a drain coupled to the drain node and a gate coupled to a reference node, and a first capacitor coupled to a source of the second GaN transistor; charging the first capacitor via the second GaN transistor; providing energy from the first capacitor to a driver circuit coupled to a gate of the first GaN transistor; and turning-off the second GaN transistor when a voltage of the first capacitor reaches a threshold.

In accordance with another embodiment, a circuit includes a first gallium nitride (GaN) transistor comprising a drain coupled to a drain node, a source coupled to a source node, and a gate coupled to a gate node; and a second GaN transistor comprising a drain coupled to the drain node, a source coupled to a first power source node configured to be coupled to a first capacitor.

In accordance with a further embodiment, a switched-mode power supply includes an integrated circuit having a first gallium nitride (GaN) transistor having a drain coupled to a drain node and a source coupled to a reference node, a second GaN transistor having a drain coupled to the drain node and a gate coupled to the reference node, wherein the first GaN transistor and the second GaN transistor are disposed on a same semiconductor substrate; a capacitor coupled to a source of the second GaN transistor; a driver circuit comprising a gate driver output coupled to a gate of the first GaN transistor, and a power supply input coupled to the capacitor.

BRIEF DESCRIPTION OF THE DRAWINGS

For a more complete understanding of the invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a system and method of starting-up a switched mode power supply using a GaN-based startup circuit. The invention may also be applied to the startup of other electronic circuits and systems.

In various embodiments, a GaN-based startup circuit is used to provide the initial startup power for an electronic system, such as a switched-mode power supply that is configured to convert a higher AC line voltage to a lower DC voltage that is usable, for example, by portable electronic systems such as smartphone, cellular telephones and tablet computers, and other electronic systems that require a DC voltage for operation. Such switched-mode power supplies generally include control and switching circuitry that also operate using a DC power supply voltage. During normal operation of the switched-mode power supply, this DC power supply voltage is often provided to the control and switching circuit by the switched-mode power supply itself. The challenge becomes how to provide a DC power supply voltage to the control and switching circuits at the initial startup of the switched-mode power supply and prior to the time that the switched-mode power supply is ready to provide power to the control and switching circuit.

In various embodiments of the present invention, this initial DC power supply voltage is provided by the AC line input to the control and switching circuit via a start-up circuit that includes a normally-on GaN transistor having a load path coupled to a capacitor and a gate coupled to a ground or reference node. During operation, the capacitor is charged by the normally-on GaN transistor while the gate-source voltage of the normally-on GaN transistor decreases. During this time, power is supplied to the control and switching circuit from the charged capacitor, which allows the control and switching circuit to start-up the switched-mode power supply. Once the switched-mode power supply has started, power is supplied to the control and switching circuit from the switched-mode power supply.

The normally-on GaN transistor may be integrated on the same semiconductor substrate as a normally-off GaN transistor used to implement a switch of the switched-mode power supply. In such embodiments, the drains of the normally-on GaN transistor may be connected together with the drain of the normally-off GaN transistor. Thus, in switched-mode flyback converters in which the switch of the switched-mode power supply is coupled to the AC line input via the primary winding of the transformer, the same AC line input (or rectified AC line input) can be made available to the normally-on GaN transistor for the purpose of starting up the switched-mode power supply. In some embodiments, the normally-off GaN transistor is implemented using a fully recessed pGaN gate with a second barrier region, while the normally-on transistor is implemented using similar processes without recessing the pGaN gate, thereby allowing for the implementation of both normally-on and normally-off GaN transistors using the same process flow. One advantage of such an embodiment is the ability to start-up the operation of a switched-mode power supply with no standby current or very little standby current. A further advantage is the ability to implement a start-up circuit in a cost efficient manner. The start-up circuit may implemented on the same substrate as the switching transistor using a semiconductor process in which both normally-on and normally-off GaN transistors can be implemented using the same process flow.

Figure 1A:
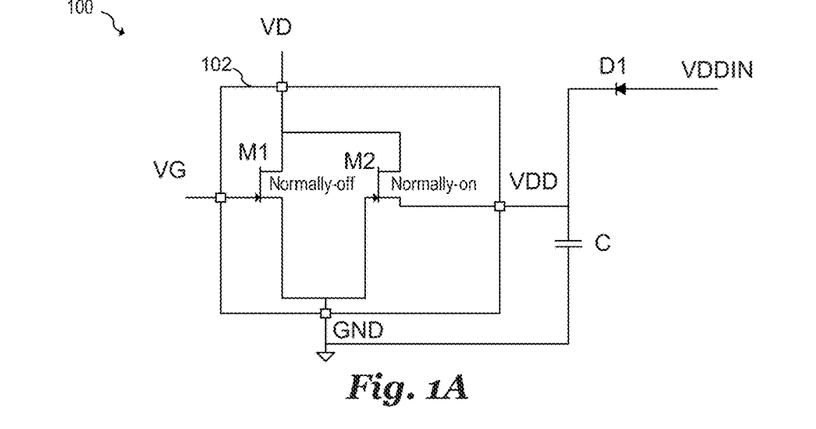
FIG. 1A illustrates a schematic of an embodiment start-up circuit.

FIG. 1A illustrates a start-up circuit 100 according to an embodiment of the present invention. As shown, start-up circuit 100 includes normally-off switch transistor M1, normally-on start-up transistor M2, capacitor C and diode D1. In various embodiments normally-off switch transistor M1 and normally-on start-up transistor M2 are implemented as GaN HEMT transistors disposed on a single semiconductor substrate and/or package 102. In alternative embodiments, however, normally-off switch transistor M1 and normally-on start-up transistor M2 may be implemented separately and/or may be implemented in other technologies besides GaN. For example, normally-off switch transistor M1 and normally-on start-up transistor M2 may be implemented as MOSFETs (Metal Oxide Semiconductor Field-Effect Transistors), IGBTs (Insulated Gate Bipolar Transistors), JFETs (Junction Field-Effect Transistors) or BJTs (Bipolar Junction Transistors) implemented using a silicon process technology or other process technologies known in the art.

Normally-off switch transistor M1 has a gate terminal coupled to node VG, a source terminal coupled to ground node GND (also referred to as a reference terminal), and a drain terminal coupled to node VD. Thus, during operation of the switched mode power supply, the gate of normally-off switch transistor M1 can be driven with a gate drive signal, such as a pulse width modulated signal at node VG while the source is grounded and the drain is coupled to a higher voltage at node VD. Normally-on startup transistor M2 has its gate coupled to ground node GND, its drain coupled to node VD, and its source coupled to power supply node VDD. Capacitor C is coupled between power supply node VDD and ground node GND. Power supply node VDD is coupled to power source node VDDIN via optional diode D1. Power source node VDDIN represents a power supply voltage that becomes available after the system to which start-up circuit 100 is coupled becomes operational. In alternative embodiments, power supply node VDD may be interfaced to power source node VDDIN using other circuits and/or circuit elements known in the art instead of diode D1, such as switches and/or switching transistors.

In one embodiment, normally-off switch transistor M1 has a threshold of between about +1V and +1.5V and normally-on startup transistor M2 has a threshold between about −4V and about −6V. In alternative embodiments of the present invention, other thresholds may be used depending on the particular embodiment and its specifications.

Figure 1B:
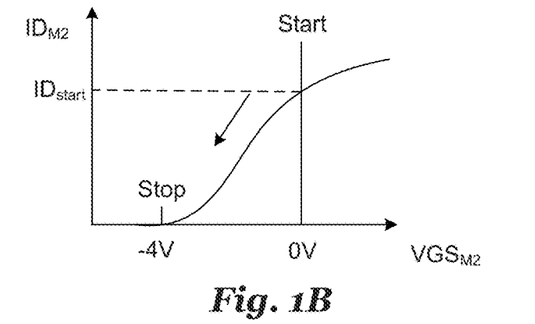
FIG. 1B illustrates an I-V curve of depletion mode transistor used in the embodiment start-up circuit of FIG. 1A.

During operation, when the circuit first starts-up, a positive voltage, also referred to as a start-up voltage, is applied to node VD. Because the voltage across capacitor C and the gate-source voltage of normally-on startup transistor M2 is zero, drain current $ID_{M2}$ flows through the load path (e.g., from the drain to the source) of normally-on startup transistor M2 and charges capacitor C. As the voltage across capacitor C increases, gate-source voltage $VGS_{M2}$ of normally-on startup transistor M2 decreases, which causes a corresponding decrease in drain current $ID_{M2}$ of normally-on startup transistor M2. The relationship between drain current $ID_{M2}$ (also known as the load path current) of normally-on startup transistor M2 is illustrated in FIG. 1B. As shown, when the gate-source voltage $VGS_{M2}$ of normally-on startup transistor M2 is zero, drain current $ID_{M2}$ has a value of $ID_{start}$. However, as the applied voltage across the gate-source voltage $VGS_{M2}$ of normally-on startup transistor M2 decreases to the threshold of −4V, drain current $ID_{M2}$ approaches zero.

Figure 1C:
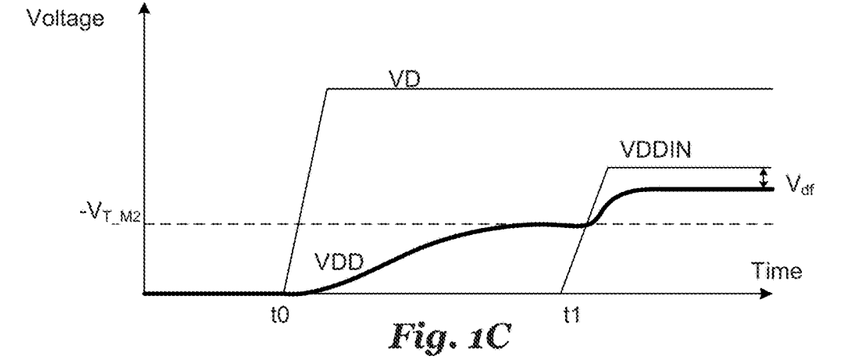
FIGS. 1C and 1D illustrate waveform diagrams demonstrating the operation of the embodiment start-up circuit of FIG. 1A.
Figure 1D:
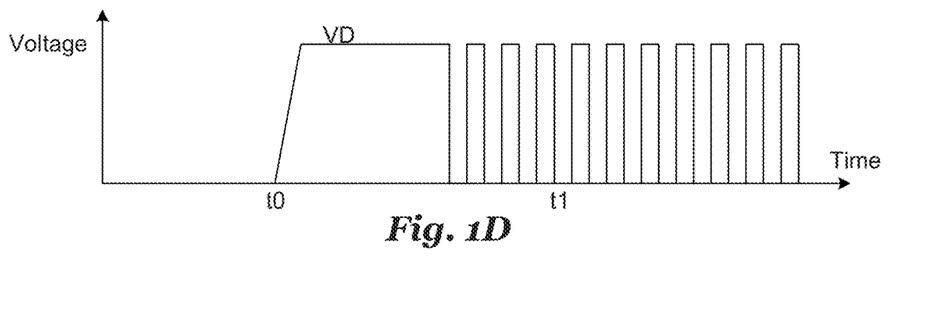

FIG. 1C illustrates a waveform diagram that shows how the voltages of drain node VD, power supply node VDD and power source node VDDIN change over time when start-up circuit 100 begins operation. As shown, at time $t_0$, a voltage is applied to drain node VD. This applied voltage at node VD may represent, for example, an AC line voltage or rectified AC line voltage being applied to node VD via a primary winding of a transformer. In some switched-mode power supply embodiments, the voltage applied to node VD may be pulsed after the initial start-up as is illustrated in FIG. 1D and described further below. Once the voltage is applied to drain node VD, the voltage of power supply node VDD starts increasing due to capacitor C being charged via the load path of normally-on start-up transistor M2. The voltage of power supply VDD increases to a voltage of $-V_{T\_M2}$, which has a magnitude of the threshold voltage of normally-off startup transistor M2. For example, if the threshold of normally-off startup transistor M2 is −4V, then $-V_{T\_M2}$ is 4V. At time $t_i$, the voltage of power source node VDDIN increases and further charges capacitor C via diode D such that the voltage of power supply node VDD is one diode drop Vdf below the voltage of power source node VDDIN. It should be appreciated that the waveform diagram of FIG. 1C is just one of many examples of the transient behavior of embodiment start-up circuits.

Figure 2:
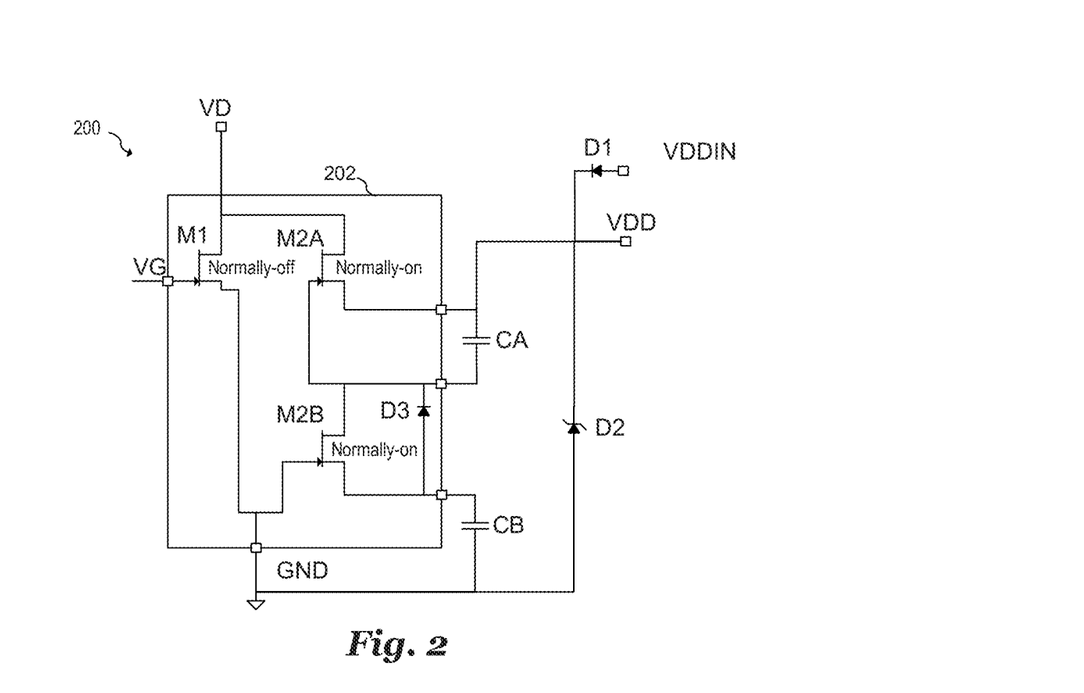
FIG. 2 illustrates a schematic of a start-up circuit according to an alternative embodiment.

In some cases, embodiment start-up circuit 100 can be modified to produce higher start-up voltages by using a plurality of normally-on start-up transistors as illustrated with respect to start-up circuit 200 shown in FIG. 2, which includes normally-off switch transistor M1, two normally-on start-up transistors M2A and M2B, capacitors CA and CB, and diodes D1, D2 and D3. As shown, normally-on start-up transistors M2A and M2B are coupled in series between drain node VD and ground node GND, with capacitors CA and CB coupled respectively between the gate and drain terminals of normally-on start-up transistors M2A and M2B. Diode D1 is coupled between nodes VDDIN and VDD, zener diode D2 is coupled between node VDD and GND, and diode D3 is coupled between the drain and source of normally-on start-up transistor M2B, The drain, gate and source of normally-on switch transistor M1 are coupled respectively to nodes VD, VG and GND in a similar manner as the start-up circuit 100 shown in FIG. 1. Normally-off switch transistor M1, normally-on start-up transistors M2A and M2B and diode D3 may be implemented on a single semiconductor substrate and/or package 202. However, in alternative embodiments, the various components shown in FIG. 2 may be partitioned differently. Normally-off switch transistor M1 and normally-on start-up transistors M2A and M2B may be implemented as GaN transistors or as other transistor types as described above.

At start-up, when a voltage is applied to node VD, normally-on start-up transistors M2A and M2B charge capacitors CA and CB such that voltage across the series combination of capacitors CA and CB is about $-V_{T\_M2A}-V_{T\_M2B}$, which has a magnitude of the sum of the threshold voltages of normally-off startup transistors M2A and M2B. Thus, the start-up circuit 200 of FIG. 2 is capable of delivering twice the start-up voltage of the start-up circuit 100 shown in FIG. 1. In alternative embodiments, additional normally-on start-up transistors can be coupled in series with normally-on start-up transistors M2A and M2B and additional corresponding capacitors can be coupled in series with capacitors CA and CB in order to further increase the start-up voltage of start-up circuit 200. For example, if three normally-on start-up transistors are coupled in series, the resulting startup-voltage between power supply node VDD and ground node GND would be three times the start-up voltage of start-up circuit 100 shown in FIG. 1.

In some embodiments, optional zener diode D2 may be used to limit and/or regulate the start-up voltage generated by start-up circuit 200. Diode D3 coupled between the source and drain of normally-on start-up transistor is included to create a discharge path for capacitor CB, and to ensure a discharge path exists between ground node GND and node VD.

Figure 3:
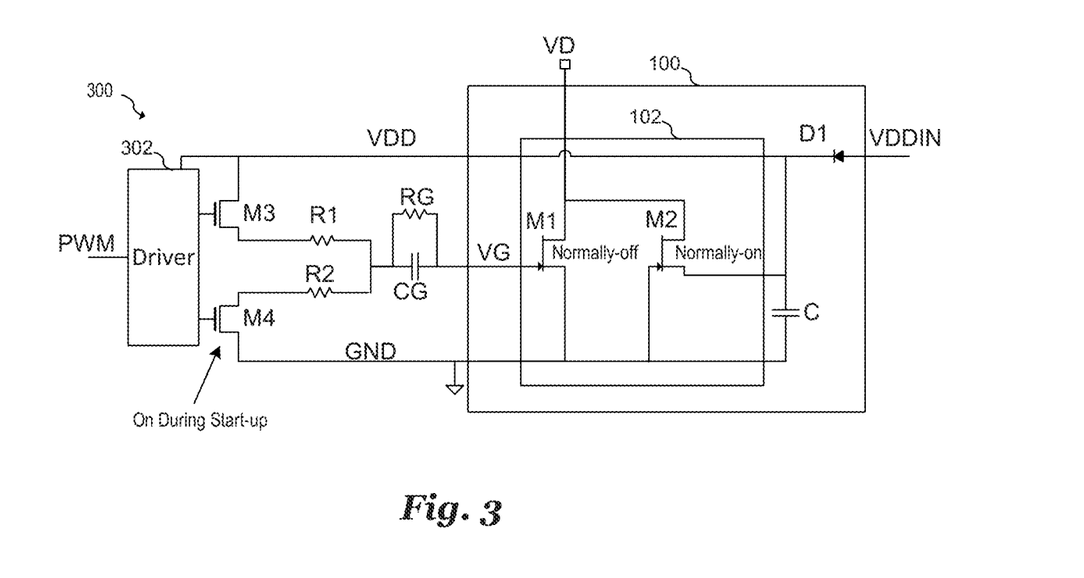
FIG. 3 illustrates a schematic diagram of an embodiment gate drive system.

FIG. 3 illustrates a schematic of a gate drive system 300 that shows how the embodiment start-up circuit can be interfaced with gate drive circuits. As shown, driver circuit 302 drives the gates of pre-driver transistors M3 and M4 based on the state of pulse-width modulated signal PWM. Pre-driver transistors M3 and M4, in turn, drive the gate of normally-off switch transistor M1. For example, when the PWM signal is in a first state, pre-driver transistor M3 is turned-on and pre-driver transistor M4 is turned-off. As a result, the voltage at power supply node VDD is applied to the gate of normally-off switch transistor M1, which turns-on normally-off switch transistor M1. On the other hand, when the PWM signal is in a second state, pre-driver transistor M3 is turned-off and pre-driver transistor M4 is turned-on. As a result, the voltage at ground node GND is applied to the gate of normally-off switch transistor M1, which turns-off normally-off switch transistor M1. In one embodiment, the PWM signal is a digital signal such that the first state of the PWM signal is a "high" state and the second state is a "low" state. In alternative embodiments, the PWM signal may be configured to be a digital active low signal such that the first state of the PWM signal is a "low" state and the second state is a "high" state. Driver circuit 302 may include, for example, digital circuitry known in the art that creates appropriate gate drive signals for pre-driver transistors M3 and M4 based on the state of the PWM signal.

In various embodiments, a gate interface network including resistors R1, R2 and RG and capacitor CG interfaces pre-driver transistors M2 and M4 to the gate of normally-off switch transistor M1. The RC network formed by resistors R1, R2 and RG and capacitor CG may be used to provide a negative turn-off voltage at the gate of transistor M1. This is particularly useful in when transistor M1 is implemented as a GaN HEMT having a relatively low threshold voltage. By using the illustrated RC network both a positive and negative gate voltage can be generated using a positive single supply voltage. It should be understood that the illustrated gate interface network is just one example of many possible gate interface network topologies. In alternative embodiments, other circuit topologies may be used depending on the particular system and its specifications.

During operation, start-up circuit 100 generates a start-up voltage at power supply node VDD that provides power to a power supply input of driver circuit 302 and pre-driver transistor M3 via normally-on start-up transistor M2 as described above. Thus, during start-up, energy from capacitor C is provided to driver circuit 302. Once the voltage of capacitor C reaches a threshold defined by the threshold voltage of normally-on start-up transistor M2, normally-on start-up transistor is turned-off. In some embodiments, when start-up circuit 100 initially turns-on, pre-driver transistor M4 is turned-on. When pre-driver transistor M4 is turned-on, the gate of normally-off switch transistor M1 is grounded, thereby shutting-off normally-off switch transistor M1. Shutting-off switch transistor M1 ensures that node VD is not shorted to ground via normally-off switch transistor M1, which would prevent capacitor C from being charged via normally-on start-up transistor M2. In some embodiments, a pulldown resistor (not-shown) may be coupled between node VG and ground node GND to ensure that normally off switch transistor M1 is initially turned-off at the beginning of a start-up sequence.

Once the system has started-up, power is provided to driver circuit 302 and pre-driver transistor M3 from power source node VDDIN via diode D1. In alternative embodiments, start-up circuit 100 shown in FIG. 3 may be replaced by other embodiment start-up circuits, such as start-up circuit 200 described above with respect to FIG. 2 in order to provide a higher start-up voltage at power supply node VDD.

Figure 4A:
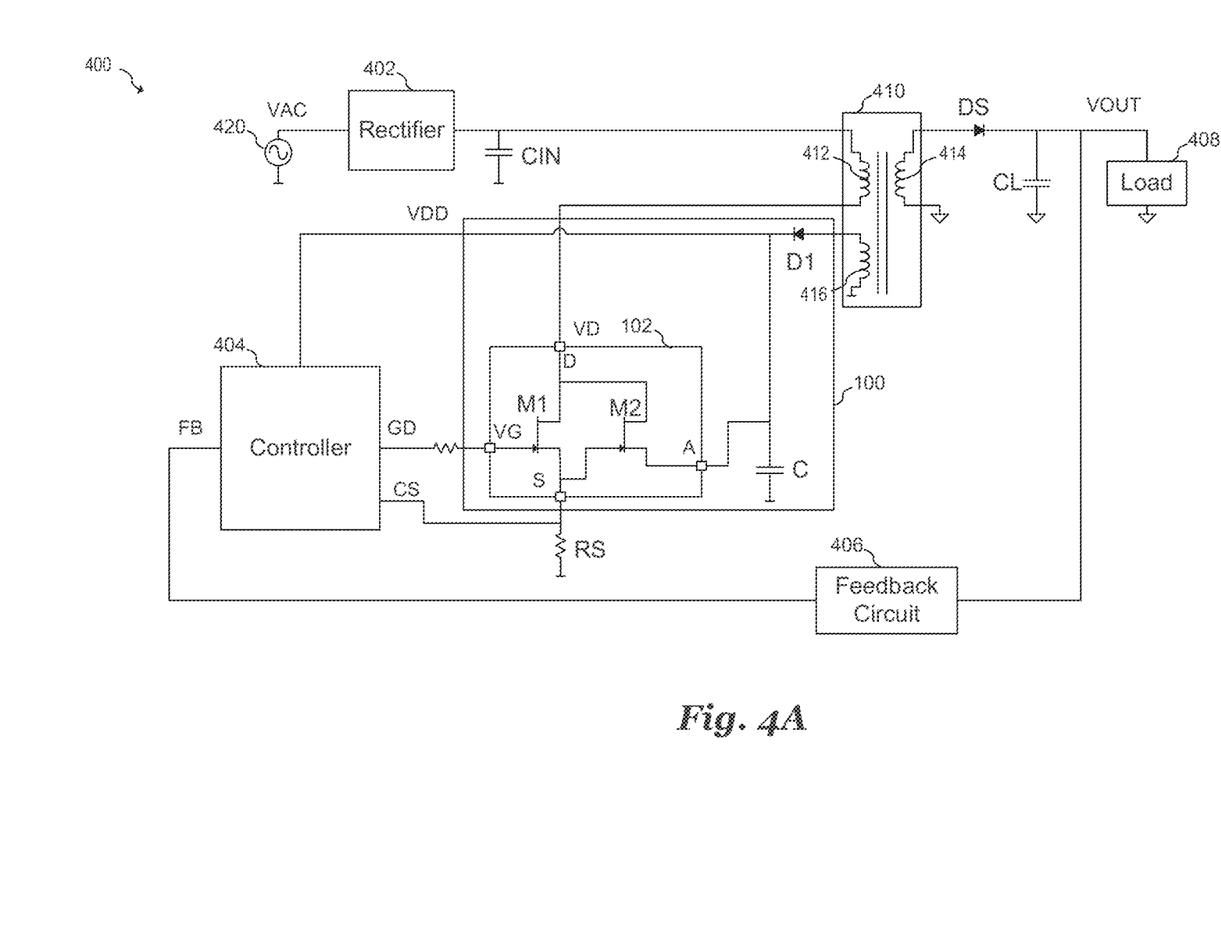
FIGS. 4A and 4B illustrate schematic diagrams of a switched-mode power converters that incorporate embodiment start-up circuits.

FIG. 4A illustrates a switched-mode power converter 400 that incorporates an embodiment start-up circuit 102. In various embodiments switched-mode power converter 400 is configured to convert an AC input voltage VAC produced by power source 420 to a DC output voltage VOUT that supplies load 408. Power source 420 may represent, for example, an AC power line. Load 408 may represent, for any type of circuitry that accepts a DC voltage, such as computer circuit, charging circuitry, and other types of circuitry. For example, switched-mode power converter 400 may convert an AC line input voltage about 240 Vrms or 120 Vrms to about 5 Vdc.

As shown, switched mode power converter includes a rectifier 402 coupled to power source 420 and to input capacitor CIN. Rectifier 402 is configured to provide full-wave or half-wave rectification of input voltage VAC. In some embodiments, rectifier 402 is implemented using a diode bridge or other rectifier circuit known in the art. The output of rectifier 402 is coupled to primary winding 412 of transformer 410. In the depicted embodiment, switched-mode power converter 400 is operated as a flyback converter. During operation, controller 404 turns normally-off switch transistor M1 on and off, which has the effect of magnetizing the primary winding 412 of transformer 410. A portion of the energy stored in primary winding 412 is transferred to secondary winding 414 of transformer 410, thereby inducing a current in the secondary winding. This induced current is rectified by diode DS, filtered by capacitor CL and provided to load 408. In some embodiments, diode DS may be replaced by a synchronous rectifier.

Another portion of the energy stored in primary winding 412 is transferred to auxiliary winding 416 in order to provide power to start-up circuit 100 and controller 404. During operation, current induced in auxiliary winding 416 is rectified by diode D1 and filtered by capacitor C in start-up circuit 100. Operation of start-up circuit 100 proceeds as described with respect to the embodiment of FIGS. 1A to 1D as described above. In an embodiment, the voltage at node VD of start-up circuit 100 during start-up behaves in accordance with the voltage waveform shown in FIG. 1D above in which voltage VD is pulsed once VDD has attained a sufficient voltage level to enable controller 404 to provide a switching signal to the gate of normally-off switch transistor M1. It is this switching signal that allows energy to be transferred from the primary winding 412 to the auxiliary winding 416 of transformer 410, which ultimately completes the start-up process of switched-mode power converter 400.

Feedback circuit 406 may be configured to measure DC output voltage VOUT at the secondary side of switched-mode power converter 400 and provide a feedback signal FB that is proportional to the measured DC output voltage VOUT. In some embodiments, feedback circuit provides galvanic isolation between the primary and secondary sides of switched-mode power converter 400. Feedback circuit 406 may be implemented, for example, using an optoisolator circuits and/or other feedback circuits suitable for use in switched-mode power converters known in the art.

In various embodiments, controller 404 is configured to generate a pulse-width modulated signal at node GD based on feedback signal FB and current sense signal CS. During normal operation, controller 404 adjusts the pulse-width of the pulse-width modulated signal in order to regulate DC output voltage VOUT. For example, when feedback signal FB indicates that the DC output voltage VOUT is below a target voltage, controller 404 increases the pulse-width of the pulse-width modulated signal at node GD, which has the effect of increasing the current produced by secondary winding 414, increasing the current available to load 408 and increasing DC output voltage VOUT. On the other hand, when feedback signal FB indicates that the DC output voltage VOUT is above the target voltage, controller 404 decreases the pulse-width of the pulse-width modulated signal at node GD, which has the effect of decreasing the current produced by secondary winding 414, decreasing the current available to load 408 and decreasing DC output voltage VOUT.

Current flowing through normally-off switch transistor M1 is determined by controller 404 by measuring the voltage across current sense resistor RS coupled in series with normally-off switch transistor M1. The measured current through RS may be used, for example, to help control the timing of the pulse-width modulated signal at node GD and/or to regulate peak or average currents within switched-mode power converter 400 in accordance with switched-mode power supply conversion systems and methods known in the art. In various embodiments, controller 404 may include gate driving circuitry suitable for driving the gate of normally-off switch transistor M1, for example, driver circuit 302, pre-driver transistors M3 and M4, and resistors R1 and R2 shown and described above with respect to FIG. 3. Other known gate driving circuits known in the art may also be used.

It should be understood that the operation and implementation of controller 404 described herein is just one of many example controllers that could be used to implement an embodiment switched-mode power converter. In alternative embodiments, other switched-mode power supply controller systems and methods known in the art may also be used.

During start-up and normal operation, power is provided to controller via node VDD. For example, as switched-mode power converter 400 initially starts-up, power is supplied to controller 404 via normally-on start-up transistor M2 in start-up circuit 100; and during normal operation, power is supplied to controller 404 via auxiliary winding 416 as explained above. In alternative embodiments, other embodiment start-up circuits, such as start-up circuit 200 described with respect to FIG. 2, may be used besides start-up circuit 100 described with respect to FIGS. 1A to 1D above.

Figure 4B:
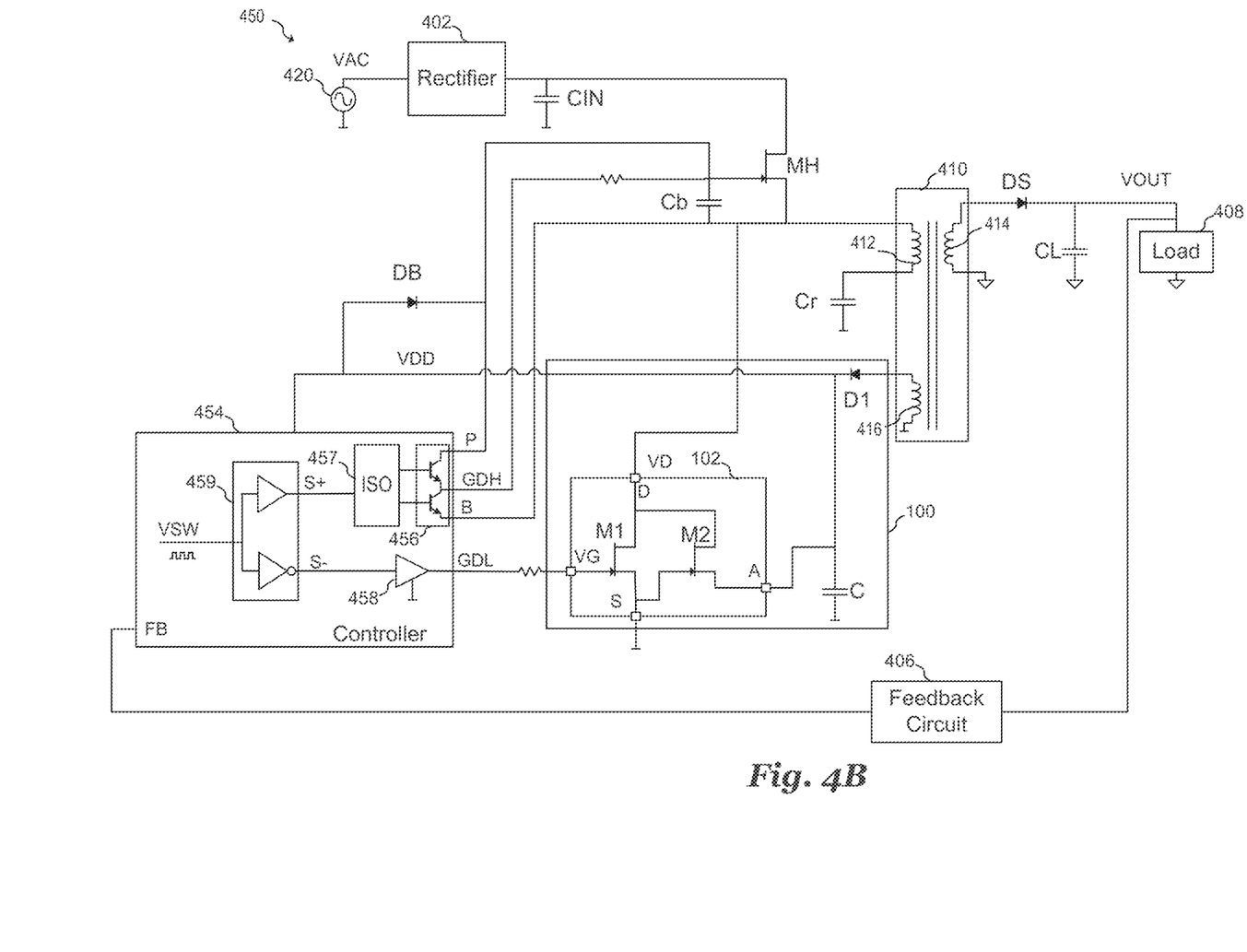

It should be understood that while FIG. 4A illustrates a switched-mode power converter configured as a flyback converter, other switch-mode power converter circuits (and non-switched-mode power converter circuits) may be used in conjunction with embodiment start-up circuits and methods. For example, in alternative embodiments of the invention, power supply topologies such as active clamp using complementary or non-complimentary control, hybrid flyback or other half bridge-based topologies may be used in along with embodiment start-up circuits. One such example of a half-bridge based topology is illustrated in FIG. 4B, which shows a switched-mode power converter 450 that incorporates an embodiment start-up circuit 102. Similar to switched-mode power converter 400 depicted in FIG. 4A, embodiment startup circuit 100 is coupled to auxiliary winding 416 in order to provide power to controller 404 during startup and during normal operation as described above.

As shown, switched-mode power converter 450 includes a half-bridge circuit having a high-side transistor MH having a source coupled to the drain of normally-off switch transistor M1 and a first end of primary winding 412 of transformer 410, while the second end of primary winding 412 is coupled to ground via resonant capacitor Cr. In various embodiments, high-side transistor MH may be implemented using a normally-off GaN transistor fabricated in a similar manner as normally-off switch transistor M1, or may be implemented using other transistor types as described above.

During operation controller 454 turns on and off high-side transistor MH and normally-off switch transistor M1 in an alternating manner. The gates of these transistors may be driven, for example by boosted gate driver 456 and driver 458 shown in controller 454 according to frequency modulated switching signal VSW. In alternative embodiments, boosted gate driver 456 and driver 458 may be implemented externally to controller 454. When high-side transistor MH is on and normally-off switch transistor M1 is off, the first end of primary winding 412 is connected to the output of rectifier 402 via high-side transistor MH. When high-side transistor MH is off and normally-off switch transistor M1 is on, the first end of primary winding 412 is connected ground via normally-on switch transistor M1.

In various embodiments, the series inductance of primary winding 412 and resonant capacitor Cr form a series resonant circuit. Accordingly, the amount of transferred from the primary side to the secondary side of switched-mode power converter 450 can be adjusted by varying the frequency of the switching signals used to activate and deactivate high-side transistor MH and normally-off switch transistor M1.

In some embodiments, high-side transistor MH is driven using a boosted gate driver 456 disposed within controller 454. As shown, the half-bridge output node B is coupled to the negative power supply terminal of boosted gate drive circuit 456, and boosted power supply node P is coupled to the positive power supply terminal of boosted gate driver 456. In some embodiments, boosted gate drive circuit be galvanically isolated from the local power supply of controller 454 using isolation circuit 457. Isolation circuit 457 may be implemented using one or more capacitors or transformers according to isolation circuits and methods known in the art. Logic circuit 459 may be used to produce logic signals S+ and S− of opposite logical sense from switching signal VSW to drive boosted gate driver circuit 456 and driver 458. During operation, bootstrap capacitor Cb is charged from power supply node VDD via diode DB when normally-on switch transistor M1 couples half-bridge output node B to ground. When normally-on switch transistor M1 is turned off via node GDL and high-side transistor MH is turned via node GDH, the voltage of half-bridge output node B increases. The increase in the voltage of half-bridge output node B causes a corresponding in the voltage of boosted power supply node P due to the charge stored across bootstrap capacitor Cb.

It should be understood that half-bridge based switched-mode power converter 450 is just one example implementation of many possible half-bridge based topologies that utilize embodiment start-up circuits. In alternative embodiments, other topologies could be used.

Figure 5:
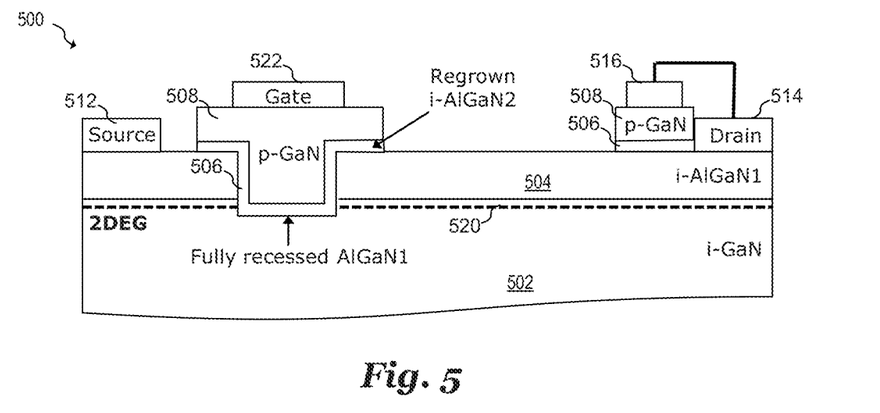
FIG. 5 illustrates a schematic cross-section of an embodiment GaN enhancement mode transistor cell.

FIG. 5 illustrates a schematic cross-section of a GaN enhancement mode transistor cell 500 that may be used to implement normally-off switch transistor M1 as described above. In various embodiments, GaN enhancement mode transistor cell 500 is a wide bandgap (WBG) semiconductor group III-V device forming a HEMT formed using gallium nitride (GaN) technology. GaN based devices are well suited for power switching applications due to the higher band gap, higher breakdown electric field, higher thermal conductivity, high saturated drift velocity, and high radiation tolerance.

GaN enhancement mode transistor cell 500 includes a channel layer 502 including undoped GaN material and a barrier layer 504 formed over channel layer 502. Channel layer 502 may disposed on a substrate (not shown) that may be a silicon substrate including a (iii) silicon, silicon on oxide (SOI), sapphire, silicon carbide, or other silicon based substrates. Alternatively, the substrate may comprise other materials.

Barrier layer 504 includes an undoped $Al_xGa_{1-x}N$ material, where x may vary from about 0.15 to about 0.30 in one embodiment. In various embodiments, channel layer 502 has a thickness between about 100 nm and about 1500 nm, and first barrier layer 504 has a thickness of between about 100 nm and about 80 nm. Values outside of these ranges may also be possible in some embodiments for x and the various thicknesses. A two-dimensional electron gas (2DEG) region 520 is formed at the junction between the AlGaN/GaN heterostructure solely from spontaneous and piezoelectric induced polarization charge.

A fully recessed gate structure includes a regrown AlGaN layer 506 disposed over a portion of channel layer 502 and extending through a recess in barrier layer 504. P-doped GaN material 508 is formed over the regrown AlGaN layer 506 and within the recess in barrier layer 504, and a gate contact 522 is formed over the p-doped GaN material 508. In some embodiments, regrown AlGaN layer 506 includes an undoped $Al_yGa_{1-y}N$ material, where y may vary from about 0.15 to about 0.25. Values outside of this range may also be possible in some embodiments.

During operation, when the voltage applied between the gate and source of GaN enhancement mode transistor cell 500 is less than a predetermined positive threshold, no current is conducted between the source and drain regions. When the applied voltage between the gate and source of GaN enhancement mode transistor cell 500 exceeds this predetermined positive threshold, current is conducted between the source and drain regions. In some embodiments, this predetermined positive threshold is between about 1V and about 1.5V. However, thresholds outside of this range may be possible depending on the specific embodiment and its implementations. Thus GaN enhancement mode transistor cell 500 functions as an enhancement mode device.

In some embodiments, an optional second p-doped region is formed over the barrier layer 504 close to the drain region and is electrically coupled to the drain contact 514. In such embodiments, the p-doped region injects holes during a hard switching event where there is simultaneous a high drain voltage and a high drain current present. These holes recombine with possibly trapped electrons in the III-N buffer layers, thereby avoiding an increased on-state resistance after the switching event (so called dynamic RDSon). As shown, this second p-doped region includes the regrown AlGaN layer 506 formed over barrier layer 504, the p-doped GaN material 508 formed over regrown AlGaN layer 506 and a second contact 516 formed over p-doped GaN material 508. Because the second p-doped region is not recessed like the first p-doped region of the gate and electrically connected to the drain region, the conducting channel formed by the 2DEG region 520 below the second p-doped region stays conductive in all cases.

A source contact 512 is formed over a source region of barrier layer 504 and a drain contact is formed over a drain region of barrier layer 504. In various embodiments, source contact 512, drain contact 514 and gate contacts 522 and 516 are ohmic contacts and are formed from a metallic and/or conductive material known in the art. For example, in one embodiment, source contact 512 and drain contact 514 are each implemented by forming a Ti/Al layer stack that includes a Ti layer disposed over barrier layer 504 and a layer of Al disposed over the Ti layer. The Ti layer may be a few tens of nanometers thick, while the Al layer may be from a few tens of nanometers thick to a few hundreds of nanometers thick. Once the Ti layer and the Al layer has been disposed over the barrier layer 504, a thermal annealing step of above 500° C. is performed such that nitrogen from the AlGaN material of barrier layer 504 is absorbed by the Ti layer, thereby creating N vacancies that act as electron donors. This mechanism effectively causes the AlGaN of barrier layer 504 below the Ti/Al metal contact to be n-doped and creates a low ohmic contact to 2DEG region 520. In some embodiments the contact resistivity can be made to be on the order of about 0.5 Ω·mm, although other values are possible.

Figure 6A:
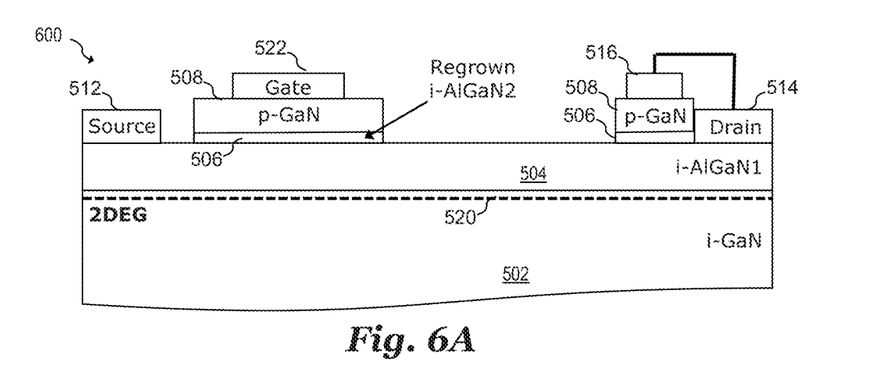
FIGS. 6A, 6B and 6C illustrate schematic cross-sections of embodiment GaN depletion mode transistor cells.

FIG. 6A illustrates a schematic cross section of a GaN depletion mode transistor cell 600 that may be used to implement normally-on switch transistors M2, M2A and M2B as described above. The structure of GaN depletion mode transistor cell 600 is similar in structure to GaN enhancement mode transistor cell 500 shown in FIG. 5 with the exception that the gate is not recessed. As shown, the gate includes a regrown AlGaN layer 506 disposed over a portion of barrier layer 504. The p-doped GaN material 508 is formed over a surface of the regrown AlGaN layer 506 (without extending through AlGaN layer 506), and the gate contact 522 is formed over the p-doped GaN material 508.

GaN depletion mode transistor cell 600 may formed in a similar manner as GaN enhancement mode transistor cell 500 with the exception that, during fabrication, the gate recess step is omitted before forming the regrown AlGaN layer 506 and p-doped GaN material 508 are formed. In some embodiments, the selection between enhancement mode and depletion mode for a particular transistor may be advantageously determined during the layout stage of the embodiment device.

During operation, when the voltage applied between the gate and source of GaN enhancement mode transistor cell 500 is greater than a predetermined negative threshold, current is conducted between the source and drain regions. However, when the applied voltage between the gate and source of GaN enhancement mode transistor cell 500 is less than this predetermined positive threshold, current is not conducted between the source and drain regions. In some embodiments, this predetermined negative threshold is between about −6V and about −4V. However, thresholds outside of this range may be possible depending on the specific embodiment and its implementations. Thus, GaN depletion mode transistor cell 600 functions as a depletion mode device.

Figure 6B:
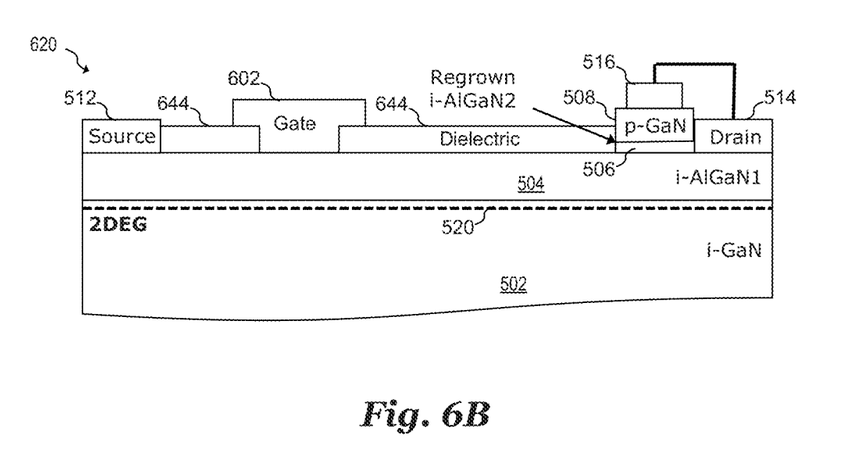

FIG. 6B illustrates a schematic cross section of a GaN depletion mode transistor cell 620 that may be used to implement normally-on switch transistors M2, M2A and M2B as described above. The structure of GaN depletion mode transistor cell 600 is similar in structure to GaN depletion mode transistor cell 600 shown in FIG. 6A with the exception that the gate is implemented using a Schottky gate metal 602 disposed over barrier layer 504. In various embodiments the gate may be made into a T-shape by etching into a first level passivation with a stop of the barrier layer 504 before gate metal deposition. Dielectric layer 644 may be disposed over barrier layer 504, as well as underneath the extended portions of Schottky gate metal 602. In one embodiment, the predetermined negative threshold is about −4.5V, however, other negative threshold values are possible.

Figure 6C:
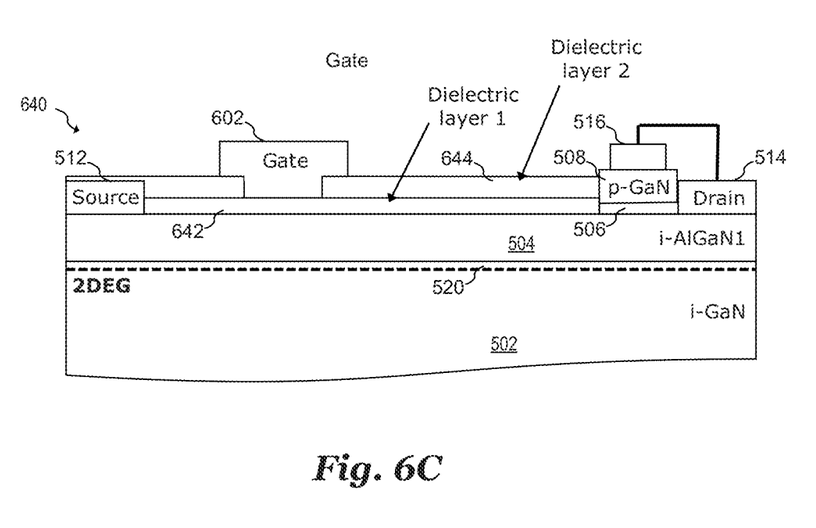

FIG. 6C illustrates a schematic cross section of a GaN depletion mode transistor cell 640 that may be used to implement normally-on switch transistors M2, M2A and M2B as described above. The structure of GaN depletion mode transistor cell 600 is similar in structure to GaN depletion mode transistor cell 600 shown in FIG. 6A with the exception that a dielectric layer 642 is disposed between Schottky gate metal 602 and barrier layer 504. By adjusting the thickness and other characteristics of the dielectric layer 642, the predetermined negative threshold of GaN depletion mode transistor cell 640 may be adjusted, for example, between about −10V and about −12V. Thresholds outside of this range may also be possible.

In various embodiments, dielectric layer 642 is implemented using silicon nitride ($Si_3N_4$) or silicon dioxide ($SiO_2$) or aluminum oxide ($Al_2O_3$), and has a thickness between about 10 nm and about 50 nm. In some embodiments, an additional dielectric layer 644 is disposed over dielectric layer 642 in order to form a T-shape gate field plate to reduce the electric field under blocking conditions at the gate foot.

Figure 7:
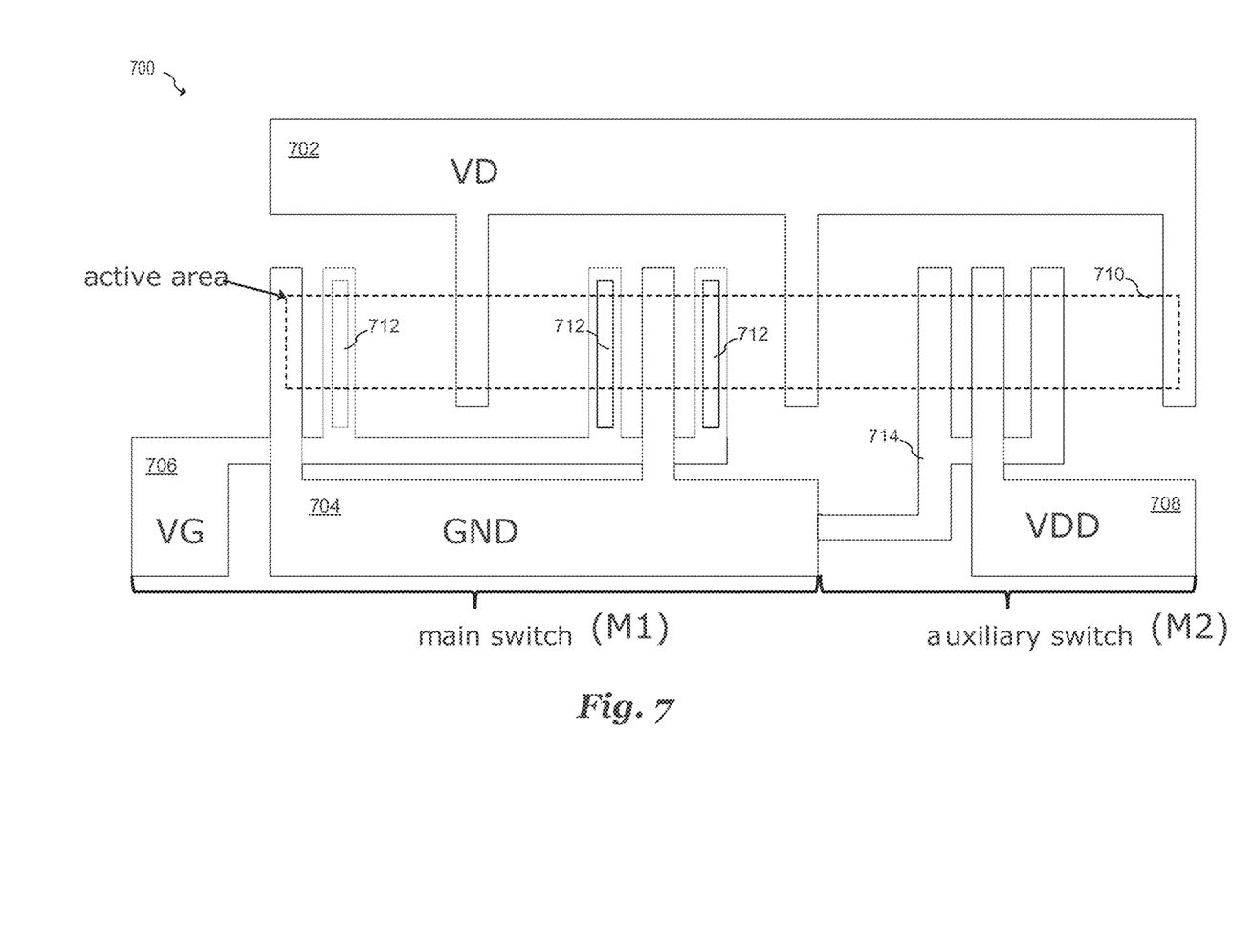
FIG. 7 illustrates a layout view of an embodiment start-up circuit cell.

FIG. 7 illustrates a layout view of an embodiment start-up circuit cell 704 that can be used to implement single semiconductor substrate in package 102 described above with respect to FIG. 1A using GaN enhancement mode transistor cell 500 described above with respect to FIG. 5 and GaN depletion mode transistor cell 600 described above with respect to FIG. 6.

As shown, the drain metallization for both transistors M1 and M2 coupled to drain node VD is represented by layer 702; the source metallization for transistor M1 coupled to ground node GND is represented by layer 704, the gate layer for transistor M1 coupled to gate node VG is represented by layer 706, the gate layer for transistor M2 coupled to node GND is represented by layer 714; and the source metallization for transistor M2 coupled to node VDD is represented by layer 708. Actual device gates are formed at the intersection of layers 712 and active area 710 and layer 714 and active area 710.

In various embodiments, regions 712 define the implementation of a fully recessed gate that can be used to implement an enhancement mode GaN transistor such as is described above with respect to FIG. 5. Accordingly, regions 712 are disposed over portions of layer 706 within active area 710 to designate transistor M1 as being an enhancement mode device. By omitting region 712, such as is the case with layer 714 representing the gate of transistor M2, the fully recessed gate is omitted and a depletion mode GaN transistor such as is described with respect to FIG. 6A is implemented. Accordingly, the designation of enhancement mode and depletion mode devices can be advantageously made by including an extra definition layer in during the layout phase of the design of a GaN integrated circuit. It should be understood that the layout of FIG. 7 is just one of many possible embodiment device layouts according to embodiment concepts. Other layouts and implementation of embodiment devices are possible.

Example embodiments of the present invention are summarized here. Other embodiments can also be understood from the entirety of the specification and the claims filed herein.

Example 1

A method of starting a circuit includes receiving a first voltage at a drain node of a start-up circuit including a first gallium nitride (GaN) transistor having a drain coupled to the drain node, a second GaN transistor having a drain coupled to the drain node and a gate coupled to a reference node, and a first capacitor coupled to a source of the second GaN transistor; charging the first capacitor via the second GaN transistor; providing energy from the first capacitor to a driver circuit coupled to a gate of the first GaN transistor; and turning-off the second GaN transistor when a voltage of the first capacitor reaches a threshold.

Example 2

The method of example 1, further including providing, by the driver circuit, a switching signal to the gate of the first GaN transistor.

Example 3

The method of example 1 or 2, where the first GaN transistor is shut-off prior to receiving the first voltage.

Example 4

The method of one of examples 1 to 3, further including: providing power to a primary winding of a transformer, where the primary winding of the transformer is coupled to the drain node of the start-up circuit; and transferring power from an auxiliary winding of the transformer to the driver circuit after turning-off the second GaN transistor.

Example 5

The method of one of examples 1 to 4, where the first GaN transistor is a normally-off device, and the second GaN transistor is a normally-on device.

Example 6

The method of one of examples 1 to 5, where the first GaN transistor and the second GaN transistor are integrated on a single semiconductor substrate.

Example 7

The method of one of examples 1 to 6, where the start-up circuit further includes: a third GaN transistor having a drain coupled to the gate of the second GaN transistor and to the first capacitor, and a gate coupled to the reference node, where the gate of the second GaN transistor is coupled to the reference node via a load path of the third GaN transistor; and a second capacitor coupled between a source of the third GaN transistor and the reference node.

Example 8

A circuit including: a first gallium nitride (GaN) transistor including a drain coupled to a drain node, a source coupled to a source node, and a gate coupled to a gate node; and a second GaN transistor including a drain coupled to the drain node, a source coupled to a first power source node configured to be coupled to a first capacitor.

Example 9

The circuit of example 8, where the second GaN transistor includes a gate coupled to the source node.

Example 10

The circuit of one of examples 8 or 9, where the first GaN transistor and the second GaN transistor are integrated on a same semiconductor substrate.

Example 11

The circuit of one of examples 8 to 10, where the first GaN transistor is a normally-off device, and the second GaN transistor is a normally-on device.

Example 12

The circuit of example 11, where: the gate of the first GaN transistor includes a fully recessed gate including a p-doped GaN material on top of a second AlGaN layer that extends through a first AlGaN layer, where the first AlGaN layer is disposed over a channel layer including undoped GaN material.

Example 13

The circuit of example 12, where the gate of the second GaN transistor is disposed over surfaces of the first and second AlGaN layers without extending through the first AlGaN layer.

Example 14

The circuit of example 12, where the gate of the second GaN transistor includes the p-doped GaN material.

Example 15

The circuit of example 12, where the gate of the second GaN transistor includes a Schottky gate.

Example 16

The circuit of example 12, further including a dielectric layer disposed between the gate of the second GaN transistor and the first AlGaN layer, where a threshold of the second GaN transistor is proportional to a thickness of the dielectric layer.

Example 17

The circuit of one of example 8 to 16, further including a gate driving circuit having a power supply input coupled to the first power source node and an output coupled to the gate node.

Example 18

The circuit of one of examples 8 to 17, further including a transformer having a first winding coupled to the drain node and an auxiliary winding coupled to the first power source node.

Example 19

The circuit of one of examples 8 to 18, further including a third GaN transistor including a drain coupled to a gate of the second GaN transistor and to a second power source node configured to be coupled to the first capacitor, a source coupled to a third power source node configured to be coupled to a second capacitor, and a gate coupled to the source node.

Example 20

The circuit of example 19, further including the first capacitor, the second capacitor, and a zener diode coupled between the first power source node and the source node.

Example 21

A switched-mode power supply including: an integrated circuit including a first gallium nitride (GaN) transistor having a drain coupled to a drain node and a source coupled to a reference node, a second GaN transistor having a drain coupled to the drain node and a gate coupled to the reference node, where the first GaN transistor and the second GaN transistor are disposed on a same semiconductor substrate; a capacitor coupled to a source of the second GaN transistor; a driver circuit including a gate driver output coupled to a gate of the first GaN transistor, and a power supply input coupled to the capacitor.

Example 22

The switched-mode power supply of example 21, further including: a transformer having a primary winding coupled to the drain node of the integrated circuit and an auxiliary winding coupled to the capacitor; and a diode coupled between the auxiliary winding and the capacitor.

Example 23

The switched-mode power supply of one of examples 21 or 22, where the first GaN transistor is a normally-off device, and the second GaN transistor is a normally-on device.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of starting a circuit, the method comprising:
receiving a first voltage at a drain node of a start-up circuit comprising a first gallium nitride (GaN) transistor having
a drain coupled to the drain node, a source coupled to a source node, and a gate coupled to a gate node,
a second GaN transistor having a drain coupled to the drain node, a source, and a gate coupled to a reference node, wherein the first GaN transistor is a normally-off device, and the second GaN transistor is a normally-on device,
and a first capacitor coupled to a source of the second GaN transistor at a power source node;
charging the first capacitor via the second GaN transistor;
providing energy from the first capacitor to a driver circuit coupled to a gate of the first GaN transistor; and
turning-off the second GaN transistor when a voltage of the first capacitor reaches a threshold.

2. The method of claim 1, further comprising providing, by the driver circuit, a switching signal to the gate of the first GaN transistor.

3. The method of claim 1, wherein the first GaN transistor is shut-off prior to receiving the first voltage.

4. The method of claim 1, further comprising:
providing power to a primary winding of a transformer, wherein the primary winding of the transformer is coupled to the drain node of the start-up circuit; and
transferring power from an auxiliary winding of the transformer to the driver circuit after turning-off the second GaN transistor.

5. The method of claim 1, wherein the first GaN transistor and the second GaN transistor are integrated on a single semiconductor substrate.

6. The method of claim 1, wherein the start-up circuit further comprises:
a third GaN transistor having a drain coupled to the gate of the second GaN transistor and to the first capacitor, and a gate coupled to the reference node, wherein the gate of the second GaN transistor is coupled to the reference node via a load path of the third GaN transistor; and
a second capacitor coupled between a source of the third GaN transistor and the reference node.

7. A circuit comprising:
a first gallium nitride (GaN) transistor comprising a drain coupled to a drain node, a source coupled to a source node, and a gate coupled to a gate node; and
a second GaN transistor comprising a drain coupled to the drain node, and a source coupled to a first power source node configured to be coupled to a first capacitor, wherein the first GaN transistor is a normally-off device, and the second GaN transistor is a normally-on device.

8. The circuit of claim 7, wherein the second GaN transistor comprises a gate coupled to the source node.

9. The circuit of claim 7, wherein the first GaN transistor and the second GaN transistor are integrated on a same semiconductor substrate.

10. The circuit of claim 7, wherein:
the gate of the first GaN transistor comprises a fully recessed gate comprising a p-doped GaN material on top of a second AlGaN layer that extends through a first AlGaN layer, wherein the first AlGaN layer is disposed over a channel layer comprising undoped GaN material.

11. The circuit of claim 10, wherein the gate of the second GaN transistor is disposed over surfaces of the first and second AlGaN layers without extending through the first AlGaN layer.

12. The circuit of claim 10, wherein the gate of the second GaN transistor comprises the p-doped GaN material.

13. The circuit of claim 7, wherein the gate of the second GaN transistor comprises a Schottky gate.

14. The circuit of claim 13, further comprising a dielectric layer disposed between the gate of the second GaN transistor and a first AlGaN layer, wherein a threshold of the second GaN transistor is proportional to a thickness of the dielectric layer.

15. The circuit of claim 7, further comprising a gate driving circuit having a power supply input coupled to the first power source node and an output coupled to the gate node.

16. The circuit of claim 7, further comprising a transformer having a first winding coupled to the drain node and an auxiliary winding coupled to the first power source node.

17. The circuit of claim 7, further comprising a third GaN transistor comprising a drain coupled to a gate of the second GaN transistor and to a second power source node configured to be coupled to the first capacitor, a source coupled to a third power source node configured to be coupled to a second capacitor, and a gate coupled to the source node.

18. The circuit of claim 17, further comprising the first capacitor, the second capacitor, and a zener diode coupled between the first power source node and the source node.

19. A switched-mode power supply comprising:
- an integrated circuit comprising a first gallium nitride (GaN) transistor having a drain coupled to a drain node and a source coupled to a reference node, a second GaN transistor having a drain coupled to the drain node and a gate coupled to the reference node, wherein the first GaN transistor and the second GaN transistor are disposed on a same semiconductor substrate, and wherein the first GaN transistor is a normally-off device, and the second GaN transistor is a normally-on device;
- a capacitor coupled to a source of the second GaN transistor; and
- a driver circuit comprising a gate driver output coupled to a gate of the first GaN transistor, and a power supply input coupled to the capacitor.

20. The switched-mode power supply of claim 19, further comprising:
- a transformer having a primary winding coupled to the drain node of the integrated circuit and an auxiliary winding coupled to the capacitor; and
- a diode coupled between the auxiliary winding and the capacitor.

\* \* \* \* \*